United States Patent
Sastry et al.

(10) Patent No.: US 8,930,008 B2
(45) Date of Patent: Jan. 6, 2015

(54) METHODOLOGY FOR DESIGN OF A MANUFACTURING FACILITY FOR FABRICATION OF SOLID STATE HYBRID THIN FILM ENERGY STORAGE AND CONVERSION DEVICES

(75) Inventors: Ann Marie Sastry, Ann Arbor, MI (US);
Xiangchun Zhang, Ann Arbor, MI (US);
Chia-Wei Wang, Ypsilanti, MI (US);
Yen-Hung Chen, Ann Arbor, MI (US);
Marc Langlois, Ann Arbor, MI (US)

(73) Assignee: Sakti3, Inc., Ann Arbor, MI (US)

( * ) Notice: Subject to any disclaimer, the term of this patent is extended or adjusted under 35 U.S.C. 154(b) by 475 days.

(21) Appl. No.: 13/359,374

(22) Filed: Jan. 26, 2012

(65) Prior Publication Data

US 2012/0130522 A1    May 24, 2012

(51) Int. Cl.
*G06F 19/00* (2011.01)
*G06Q 30/00* (2012.01)
*A01K 5/02* (2006.01)
*G05B 19/418* (2006.01)

(52) U.S. Cl.
CPC .... *G05B 19/418* (2013.01); *G05B 2219/31395* (2013.01); *G05B 2219/31396* (2013.01)
USPC .............. 700/99; 700/97; 705/7.38; 705/29

(58) Field of Classification Search
CPC . H01M 10/052; H01M 6/40; H01M 10/0562; H01M 10/0436; H01M 4/405; H01M 10/0587; H01M 10/054; H01M 2/1077; H01M 4/40; H01M 2/08; H01M 4/525; H01M 4/661; H01M 2004/021; H01M 2/0275; H01M 4/04
See application file for complete search history.

(56) References Cited

U.S. PATENT DOCUMENTS

| | | | | |
|---|---|---|---|---|
| 4,615,011 A | * | 9/1986 | Linsker | 716/126 |
| 4,998,206 A | * | 3/1991 | Jones et al. | 700/96 |
| 5,260,866 A | * | 11/1993 | Lisinski et al. | 705/29 |
| 5,326,652 A | * | 7/1994 | Lake | 429/127 |
| 5,357,440 A | * | 10/1994 | Talbott et al. | 700/97 |

(Continued)

OTHER PUBLICATIONS

Zhang et al., "Numercial Simulation of Intercalation-Induced Stress in Li-Ion Battery Electrode Paraticles", ECS, 2007, 7 pages.*

(Continued)

*Primary Examiner* — Kavita Padmanabhan
*Assistant Examiner* — Thomas Stevens
(74) *Attorney, Agent, or Firm* — Richard T. Ogawa; Ogawa P.C.

(57) ABSTRACT

A method and system for designing a manufacturing facility for solid state thin film battery devices. The method can include providing a plurality of processing tools for arrangement within a predetermined spatial region of one or more manufacturing facilities. A plurality of variables can be assigned for the plurality of processing tools. A target financial variable can be defined to evaluate different manufacturing processing tool configurations. The plurality of variables in the tensor relationship can be processed to reduce a magnitude of the target variable. An optimized set of the plurality of processing tools and respective configuration with the plurality of tools associated with the reduced magnitude of the target variable can be determined through processing. The optimized set of the plurality of processing tools in the respective configuration can be used in the one or more manufacturing facilities for the manufacture of a solid state thin film battery device.

17 Claims, 8 Drawing Sheets

(56) References Cited

U.S. PATENT DOCUMENTS

| | | | |
|---|---|---|---|
| 5,359,523 A * | 10/1994 | Talbott et al. | 700/97 |
| 5,630,070 A * | 5/1997 | Dietrich et al. | 705/7.23 |
| RE35,746 E * | 3/1998 | Lake | 429/127 |
| 6,391,490 B1 * | 5/2002 | Aoi et al. | 429/176 |
| 7,110,297 B2 * | 9/2006 | Morikawa et al. | 365/185.14 |
| 7,139,202 B2 * | 11/2006 | Matsuoka et al. | 365/189.16 |
| 7,723,606 B2 * | 5/2010 | Fiorini et al. | 136/205 |
| 7,945,344 B2 * | 5/2011 | Wang et al. | 700/103 |
| 8,301,285 B2 * | 10/2012 | Zhang et al. | 700/97 |
| 2011/0287317 A1 * | 11/2011 | Nakanishi | 429/218.1 |
| 2014/0170466 A1 * | 6/2014 | Spotnitz et al. | 429/149 |

OTHER PUBLICATIONS

Jones-K.S., "Solid-State Batteries", University of Florida Point Point Presentation, 2011, 60 pages.*

Du et al., "Effect of Cycling Rate, Particle Size and Transport Properties on Lithium-ion Cathode Performance", ProQuest Dissertations, abstract, International Journal of Heat and Mass Transfer, 2010, pp. 3552-3561.*

Landstorfer et al., "An Advanced Model Framework for Solid Electrolyte Intercalation Batteries", Dynamic Article Links, May 2011, 9 pages.*

Wang et al., Mesoscale Modeling of a Li-Ion Polymer Cell, Journal of Electrochemical Society, 2007, 13 pages.*

* cited by examiner

Example design

|  | i=1 | i=2 | i=3 | i=4 | i=5 |
|---|---|---|---|---|---|
| j=1 | B | D | D | D | B |
| j=2 |  | D | D | D |  |
| j=3 |  | D | D |  |  |
| j=4 |  | D |  |  |  |

IRR=0.112
CAPEX= $ 54 M
Production rate: 0.7599 M units/year

301

Optimal design

|  | i=1 | i=2 | i=3 | i=4 | i=5 |
|---|---|---|---|---|---|
| j=1 | A | D | D | D | B |
| j=2 |  | D | D |  |  |
| j=3 |  | D |  |  |  |
| j=4 |  |  |  |  |  |

IRR=0.139
CAPEX=$ 37.5 M
Production rate: 0.6079 M units/year

| | Current collector | Cathode | Electrolyte | Anode | Barrier |
|---|---|---|---|---|---|
| Processing tool type | B | D | D | D | B |
| Processing tool quantity | 1 | 4 | 3 | 2 | 1 |

T(:,:,1) =
```
 0  0  0  0  0
 1  0  0  0  1
 0  0  0  0  0
 0  1  1  1  0
```

T(:,:,3) =
```
 0  0  0  0  0
 0  0  0  0  0
 0  0  0  0  0
 0  1  1  0  0
```

T(:,:,2) =
```
 0  0  0  0  0
 0  0  0  0  0
 0  0  0  0  0
 0  1  1  1  0
```

T(:,:,4) =
```
 0  0  0  0  0
 0  0  0  0  0
 0  0  0  0  0
 0  1  0  0  0
```

| | i=1 | i=2 | i=3 | i=4 | i=5 |
|---|---|---|---|---|---|
| j=1 | B | D | D | D | B |
| j=2 |  | D | D | D |  |
| j=3 |  | D | D |  |  |
| j=4 |  | D |  |  |  |

FIG. 4

| Tool and facility type indexing table | | | |
|---|---|---|---|
| Number | Tool type | Number | Facility type |
| $k=1$ | coater | $l=1$ | e-gun |
| $k=2$ | winder | $l=2$ | thickness sensor |
| $k=3$ | slitter | $l=3$ | Ion-gun |
| | | $l=4$ | thermal evaporation |
| | | $l=0$ | Facility type does not apply to a tool | process step 1
$T_{1111} = 1$ process step 2
$T_{2113} = 1$
$T_{2214} = 1 \quad T_{2212} = 1$ process step 3
$T_{3120} = 1$

| Optimal Configuration | Production rate (M batteries/year) | CAPEX (M $) | X<sup>c</sup>/R | IRR* |
|---|---|---|---|---|
| [1,1,2,5,1,5,2,1] | 0.458 | 19.1 | 0.0240 | 0.201 |

METHODOLOGY FOR DESIGN OF A MANUFACTURING FACILITY FOR FABRICATION OF SOLID STATE HYBRID THIN FILM ENERGY STORAGE AND CONVERSION DEVICES

BACKGROUND OF THE INVENTION

This present invention relates to manufacture of electro-chemical cells. More particularly, the present invention provides a method and system for a manufacturing facility for fabrication of thin film energy devices. Merely by way of example, the invention has been provided for the manufacture of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

Common electro-chemical cells often use liquid electrolytes. Such cells are typically used in many conventional applications. Alternative techniques for manufacturing electro-chemical cells include solid state cells. Such solid state cells are generally in the experimental state, have been difficult to make, and have not been successfully produced in large scale. Although promising, solid state cells have not been achieved due to limitations in cell structures and manufacturing techniques. These and other limitations have been described throughout the present specification and more particularly below.

Solid state batteries have been proven to have several advantages over conventional batteries using liquid electrolyte in lab settings. Safety is the foremost one. Solid state battery is intrinsically more stable than liquid electrolyte cells since it does not contain a liquid that causes undesirable reaction, resulting thermal runaway, and an explosion in the worst case. Solid state battery can store over 30% more energy for the same volume or over 50% more for the same mass than conventional batteries. Good cycle performance, more than 10,000 cycles, and a good high temperature stability also has been reported.

Despite of these outstanding properties of solid state batteries, there are challenges to address in the future to make this type of batteries available in the market. To exploit the compactness and high energy density, no metal housing or excessive substrate should be used. To be used in variety of applications such as consumer electronics or electric vehicle, large area and fast film deposition techniques at low cost should be developed. Also, a solid state, hybrid thin film energy storage and conversion device, such as solid—a state battery, a solid oxide fuel cell, a capacitor, a photovoltaic cell and a hybrid device of these, consists of several components of thin film layers. These thin film layers are made from different materials and of different thicknesses. The deposition rate of laying down a material using a physical vapor deposition technique to form the thin film layer varies with the material and the processing technique used. Each individual layer requires a different time to finish to make a thin film device.

The production rate of solid state batteries, in terms the number of device units made per unit time, depends on the slowest, rate-limiting processing step for the layer with the largest thickness to deposition rate ratio. Multiple deposition zones and multiple deposition chambers are used to speed up the rate-limiting processing step by distributing the deposition task in parallel to the assigned multiple zones and chambers. However, the added deposition zones and chambers increase the total capital and operational expenditure for the manufacturing facility. It is necessary to optimize the number of deposition zones and chambers to balance the competition between cost and production rate. The same optimization necessity exists for other solid state, hybrid thin film energy storage and conversion device manufacturing processing steps including chemical vapor deposition, atomic layer deposition, winding, slitting, packaging using a technique of at least but not limited to dip coating, and robotic arm operations for attaching leads, wiring, moving, handling and electronic control component assembling.

However, the existing manufacturing facilities for solid state, hybrid thin film energy storage and conversion devices, including solid-state batteries, solid oxide fuel cells, capacitors, photovoltaic cells and hybrid devices of these, are designed in an arbitrary and subjective intuition-based fashion without conducting a systematical and mathematical analysis to identify the optimal design.

From the above, it is seen that techniques for improving the manufacture of solid state cells are highly desirable.

BRIEF SUMMARY OF THE INVENTION

This present invention relates to manufacture of electro-chemical cells. More particularly, the present invention provides a method and system for a manufacturing facility for fabrication of thin film energy devices. Merely by way of example, the invention has been provided for the manufacture of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

In an embodiment, the present invention presents a system for and a methodology to design a manufacturing facility for the fabrication of solid state, hybrid thin film energy storage and conversion devices using a systematical and mathematical approach which applies a tensorial notation to represent processing tool configuration and integer programming-based optimization to identify the optimal manufacturing facility configuration to maximize specified target financial variables including internal rate of return (IRR), modified internal rate of return (MIRR), net present value (NPV) and weighted average cost of capital (WACC).

In an embodiment, the present invention provides a method for forming a manufacturing facility. The method can include providing a plurality of processing tools for arrangement within a predetermined spatial region of one or more manufacturing facilities. A plurality of variables can be assigned, respectively, for the plurality of processing tools. These variables can be provided in a tensor format. A target financial variable can be defined to evaluate different manufacturing processing tool configurations. The plurality of variables in the tensor relationship can be processed to reduce a magnitude of the target variable. Through the processing, an optimized set of the plurality of processing tools and respective configuration with the plurality of tools associated with the reduced magnitude of the target variable can be determined. The optimized set of the plurality of processing tools in the respective configuration can be used in the one or more manufacturing facilities. Furthermore, the optimized set of tools can be operated for the manufacture of a solid state thin film battery device. Those skilled in the art will recognize other variations, modifications, and alternatives.

In an embodiment, the present invention provides a system for designing a manufacturing plant. This system can include a computer readable memory device, one or more codes directed to a plurality of variables, a tensor operation module, a financial modeling module, an optimization module, and a post-processing module. The computer readable memory device can include one or more codes directed to a plurality of tool parameters corresponding respectively to a plurality of processing tools for arrangement within a predetermined spatial region of one or more manufacturing facilities. The one or more codes directed to a plurality of variables, respectively, can be for the plurality of processing tools, whereupon the plurality of variables are arranged in a tensor format, with the one or more codes directed to a processing tool configuration tensor. The tensor operation module can be configured to process the plurality of variables and the configuration tensor to obtain the production rate, capital expenditure, and operation expenditure. The financial modeling module can be used to reduce a magnitude of a target financial variable associated with a set of the plurality of variables and the configuration tensor. The target financial variable can include at least the internal rate of return (IRR), modified internal rate of return (MIRR), the net present value (NPV), and the weighted average cost of capital (WACC). The optimization module can be configured to output an optimized configuration tensor associated with the optimal target financial variable value. The post-processing module can be configured to convert the optimal configuration tensor to output the optimized set of tools and associated configuration of the set of tools. Those skilled in the art will recognize other variations, modifications, and alternatives.

Benefits are achieved over conventional techniques. Depending upon the specific embodiment, one or more of these benefits may be achieved. In one or more embodiments, the present invention provides a method for designing solid state thin film energy devices that are optimized to minimize manufacturing time, costs, and flaws, as well as a system implementing such a method. Of course, there can be other variations, modifications, and alternatives.

The present invention achieves these benefits and others in the context of known process technology. However, a further understanding of the nature and advantages of the present invention may be realized by reference to the latter portions of the specification and attached drawings.

BRIEF DESCRIPTION OF THE DRAWINGS

The following diagrams are merely examples, which should not unduly limit the scope of the claims herein. One of ordinary skill in the art would recognize many other variations, modifications, and alternatives. It is also understood that the examples and embodiments described herein are for illustrative purposes only and that various modifications or changes in light thereof will be suggested to persons skilled in the art and are to be included within the spirit and purview of this process and scope of the appended claims.

FIG. 3 is a simplified comparison of an example plant design configuration against the optimized design configuration;

FIG. 4 is a simplified illustration of the set up of configuration tensor according to an embodiment of the present invention;

DETAILED DESCRIPTION OF THE INVENTION

This present invention relates to manufacture of electrochemical cells. More particularly, the present invention provides a method and system for a manufacturing facility for fabrication of thin film energy devices. Merely by way of example, the invention has been provided for the manufacture of lithium based cells, but it would be recognized that other materials such as zinc, silver, copper and nickel could be designed in the same or like fashion. Additionally, such batteries can be used for a variety of applications such as portable electronics (cell phones, personal digital assistants, music players, video cameras, and the like), power tools, power supplies for military use (communications, lighting, imaging and the like), power supplies for aerospace applications (power for satellites), and power supplies for vehicle applications (hybrid electric vehicles, plug-in hybrid electric vehicles, and fully electric vehicles). The design of such batteries is also applicable to cases in which the battery is not the only power supply in the system, and additional power is provided by a fuel cell, other battery, IC engine or other combustion device, capacitor, solar cell, etc.

Figure 1:
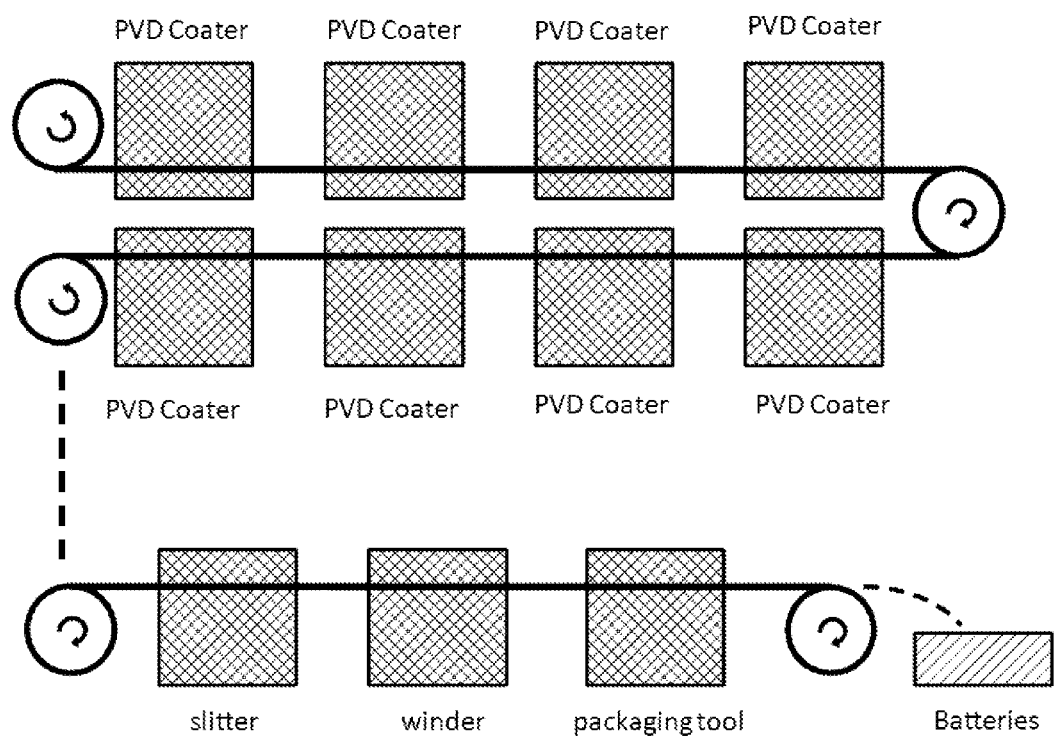
FIG. 1 is a simplified diagram of a thin film battery manufacturing plant layout according to an embodiment of the present invention.

FIG. 1 is a simplified diagram of a thin film battery manufacturing plant layout according to an embodiment of the present invention. This diagram is merely an illustration and should not unduly limit the scope of the claims herein. As shown, the plant layout includes several rotating units that control a moving surface, such as a conveyer belt or web. Batteries or other sources of energy can be used to drive the rotating units. The moving surface runs through several tools, each with a specified function. In a specific embodiment, the PVD Coater tools can be configured to for physical vapor deposition of one or more materials to form thin film layers for a battery device. Also, the slitter may be configured to remove excess portions of deposited layers, and the winder may be configured to coil the thin film layers. The packaging tool can encapsulate the electrochemically active materials in a sealed unit. One of ordinary skill in the art would recognize many variations, modifications, and alternatives to such a lay out, such as adding or removing chambers and adding or removing functions for individual chambers.

Figure 2:
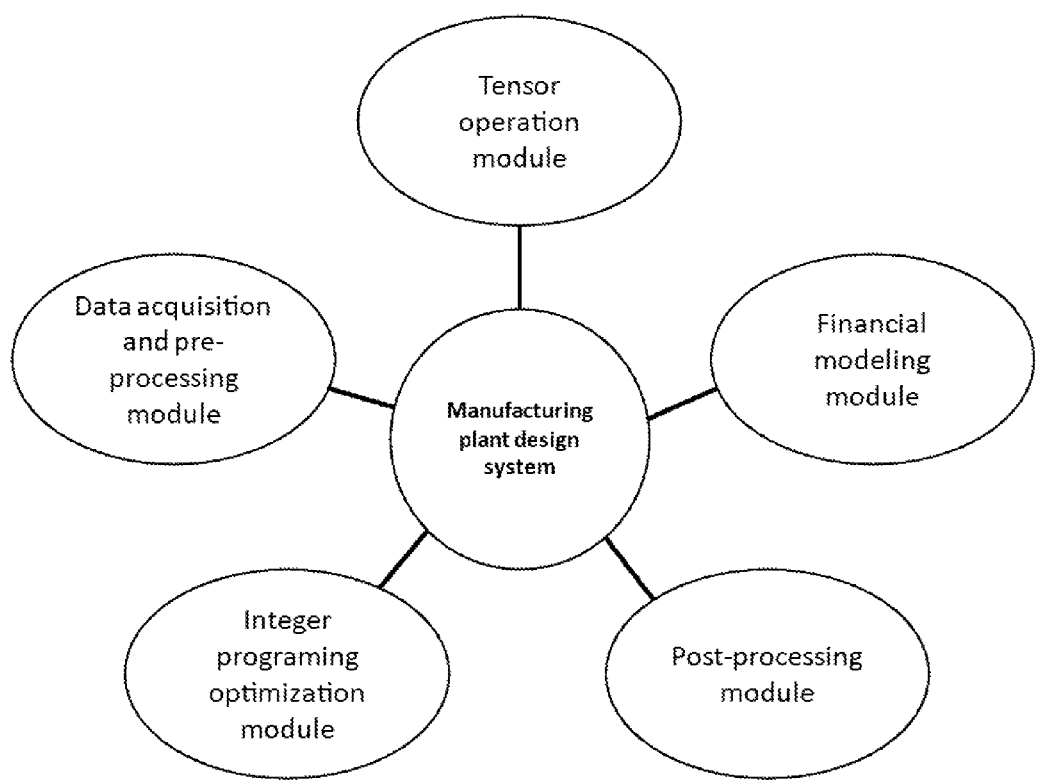
FIG. 2 is a simplified diagram of modules of the code included in the manufacturing plant design system according to an embodiment of the present invention.

FIG. 2 is a simplified diagram of modules of the code included in the manufacturing plant design system according to an embodiment of the present invention. The system comprises codes of data acquisition and pre-processing module, tensor operation module, financial modeling module, integer programming optimization module and post-processing module. Of course, those skilled in the art will recognize other variations, modifications, and alternatives for modules of code to be incorporated into the manufacturing plant design system.

In an embodiment, the present invention provides a method for forming a manufacturing facility. The method can include providing a plurality of processing tools for arrangement within a predetermined spatial region of one or more manufacturing facilities. A plurality of variables can be assigned, respectively, for the plurality of processing tools. These variables can be provided in a tensor format. A target financial variable can be defined to evaluate different manufacturing processing tool configurations. The plurality of variables in the tensor relationship can be processed to reduce a magnitude of the target variable. Through the processing, an optimized set of the plurality of processing tools and respective configuration with the plurality of tools associated with the reduced magnitude of the target variable can be determined. The optimized set of the plurality of processing tools in the respective configuration can be used in the one or more manufacturing facilities. Furthermore, the optimized set of tools can be operated for the manufacture of a solid state thin film battery device. Those skilled in the art will recognize other variations, modifications, and alternatives.

In a specific embodiment, the plurality of processing tools can include physical vapor deposition based thin film coaters, chemical vapor depositions based thing film coaters, atomic layer deposition thin film coaters, winders, slitters, packaging machines, and the like. The packing machine can use techniques of at least but not limited to dip coating and robotic arms for attaching leads, wiring, moving, handling, and electronic control component assembling. The physical vapor deposition based thin film coaters can include at least one of the processing facilities, which can include a vacuum chamber, an electron-beam evaporator, a thermal evaporator, a pulsed laser deposition tool, a flash evaporator, and an ion-beam assisted deposition tool and an ion-beam sputtering tool. These tools can be implemented in a plant, such as the one shown in FIG. 1. The tools mentioned herein can be added to or removed from the sequence of tools configured in the plant layout.

In a specific embodiment, the plurality of variables can include the capital cost of the tool, throughput of the tool, downtime of the tool, yield of the tool, efficiency of the tool, material load and unload time of the tool, preparation time of the tool, work in process for the tool and operational cost of the tool, including labor and electricity cost. The target financial variable can include at least the internal rate of return (IRR), modified internal rate of return (MIRR), net present value (NPV), and the weighted average cost of capital (WACC). In a specific embodiment, the target financial variable can be calculated based on inputs, which include expenditure, production rate, profit of one single product unit, operation expenditure, and discount rate. Also, the target financial variable is simplified as the ratio of capital expenditure over production rate for a first-order analysis. The total capital expenditure can be provided by a sum of the capital expenditure of the plurality of processing tools associated with processing facilities include inside the tools. The production rate can be provided by a throughput rate of a rate-limiting processing tool. Of course, there can be variations, modifications, and alternatives.

In an embodiment, the manufacturing facility can be configured with at least one of the designs including a continuously moving web design and a carousel design. In the continuously moving web design, a web continuously moves through each processing tool during which period the materials are deposited. The web is slit and wound and the cells are packaged. In the carousel design, a drum stays in each processing tool for a certain period until the processing task is finished and moves to the next process tool. In the carousel design, the number of drums is equal to the number of total processing tools and all the processing tools are arranged along a circular line.

In a specific embodiment, the battery device can be a solid state, hybrid thin film energy storage and conversion device. This device can include at least a solar cell device/battery device, an optical device/battery device, a capacitor device/battery device, a fuel cell device/battery device, a first battery device/second battery device, and a micro-combustion engine device/battery device. Those skilled in the art will recognize other variations, modifications, and alternatives.

In an embodiment, the present invention provides a system for designing a manufacturing plant. This system can include a computer readable memory device, one or more codes directed to a plurality of variables, a tensor operation module, a financial modeling module, an optimization module, and a post-processing module. The computer readable memory device can include one or more codes directed to a plurality of tool parameters corresponding respectively to a plurality of processing tools for arrangement within a predetermined spatial region of one or more manufacturing facilities. The one or more codes directed to a plurality of variables, respectively, can be for the plurality of processing tools, whereupon the plurality of variables are arranged in a tensor format, with the one or more codes directed to a processing tool configuration tensor. The tensor operation module can be configured to process the plurality of variables and the configuration tensor to obtain the production rate, capital expenditure, and operation expenditure. The financial modeling module can be used to reduce a magnitude of a target financial variable associated with a set of the plurality of variables and the configuration tensor. The target financial variable can include at least the internal rate of return (IRR), modified internal rate of return (MIRR), the net present value (NPV), and the weighted average cost of capital (WACC). The optimization module can be configured to output an optimized configuration tensor associated with the optimal target financial variable value. The post-processing module can be configured to convert the optimal configuration tensor to output the optimized set of tools and associated configuration of the set of tools. Those skilled in the art will recognize other variations, modifications, and alternatives.

In a specific embodiment, the processing tool configuration tensor is an n-order tensor with n dimensions to index a plurality of specifications including at least the processing step, allocated locations for tools inside the processing step, processing tool type, and the type of facility used inside a processing tool. The processing tool configuration tensor in also include elements which have binary values of zero and one. An element has the value of one if and only if the specified allocated location for the specified processing step is occupied by the specified processing tool including the specified processing facility. Otherwise, the tensor element has the value of zero.

In a specific embodiment, the tensor operation modules comprises adding two tensors, multiplying two tensors, transposing first-order and second-order tensors, contracting a tensor and finding the maximum or minimum element of a tensor or a subset of the tensor along with specified dimensions. In a specific embodiment, the optimization module includes one or more codes directed to an integer programming optimization process applying enumerative techniques, branch-and-bound techniques, or cutting planes techniques.

In a specific embodiment, the post-processing module includes importing the optimal configuration tensor, identifying the non-zero elements which have exactly values of one and outputting the optimal configuration information with specifications of which type of and how many processing tools are used for each processing step associated with which type and how many processing facilities are used inside each processing tool.

In a specific embodiment, the enumerative optimization procedure comprises a parallelized implementation of the enumeration of the feasible possibilities to speed up the computation process on a shared memory and multi-processing unit computing system. Of course, those skilled in the art will recognize other variations, modifications, and alternatives.

FIG. 3 is a simplified comparison of an example plant design configuration against the optimized design configuration. In this example, there are five processing steps (i=1, 2, 3, 4, 5). There are four different types of processing tools to choose from (k=1, 2, 3, 4). These four processing tools are represented by A, B, C, D. Each of the processing tool has its own deposition rate for a given processing step and the cost is also different for different type of tools. It is also assumed that maximum of four locations are allocated for each processing step (j=1, 2, 3, 4). An example design is given in 301 in FIG. 3. In this example design, one tool B is assigned to processing step 1; four tools of D are assigned to processing step 2; three tools of D are assigned to processing step 3; two tools of D are assigned to processing step 4; one tool of B is assigned to processing step 5. The obtained internal rate of return from the financial modeling module is 0.112. The corresponding production rate is 0.7599 million units per year, and the corresponding capital expenditure is 54 million dollars. This example design is chosen arbitrarily without conducting optimization. If the internal rate of return is used as an objective function to be maximized, one can conduct an optimization process to identify the optimal configuration as shown in 302 in FIG. 3. This optimal configuration assigns one tool of A for step 1, three tools of D for step 2, two tools of D for step of 3, one tool of D for step 4 and one tool of B for step 5. This optimal configuration yields an IRR of 0.139. The corresponding production rate is 0.6079 million units per year and the capital expenditure is 37.5 million dollars. The optimization technique used is enumeration to go through all the possible combinations for the configuration tensor. The computational time of the enumeration based optimization for this case was reduced from 10.2 minutes to 1.38 minutes when a parallel computing was implemented to increase the utilized process units from one to eight.

FIG. 4 is a simplified illustration of the set up of configuration tensor according to an embodiment of the present invention. In this case, the configuration tensor is a third-order tensor. There are five processing steps to deposit current collector, cathode, electrolyte, anode and barrier respectively. These five process steps are specified by the index of i in the tensor $T_{kij}$. Four different types of processing tools A, B, C and D are used. Processing tool is specified by the index of k in the tensor $T_{kij}$. Assuming that maximum of 4 positions are assigned to each processing step for the processing tools. The position is specified by index j in the tensor $T_{kij}$. If three type D processing tools are used for step number 3 (electrolyte deposition), the configuration tensor T has three non-zero elements, $T_{431}$, $T_{432}$ and $T_{433}$ associated with step number 3 (i=3). The corresponding elements of $T_{131}$, $T_{231}$, $T_{331}$, $T_{132}$, $T_{232}$, $T_{332}$, $T_{133}$, $T_{233}$, $T_{333}$, $T_{134}$, $T_{234}$, $T_{334}$, $T_{434}$ associated with step number 3 (i=3) are all zero. To further illustrate how the configuration tensor is set up, consider position 2 (j=2) of processing step 3 for the electrolyte deposition. This position is occupied with tool type D (k=4). Therefore, the tensor element of $T_{432}=1$. Position 4 of processing step 3 is not occupied by any tool, so $T_{k34}=0$ (where k=1,2,3,4).

Figure 5:
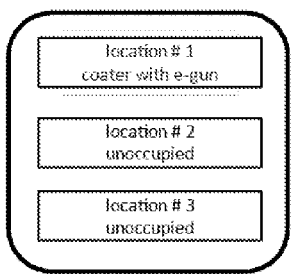
FIG. 5 is a simplified illustration of the set up of a fourth-order configuration tensor according to an embodiment of the present invention.
Figure 5:
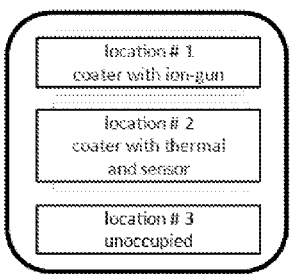
Figure 5:
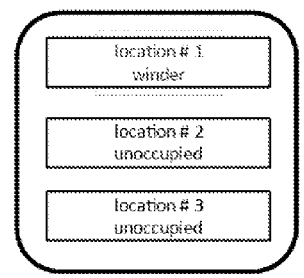

FIG. 5 is a simplified illustration of the set up of a fourth-order configuration tensor according to an embodiment of the present invention. In this example, there are three processing steps, i=1, 2, and 3. In each processing step, there are three pre-allocated positions, j=1, 2 and 3. There are three type of process tools with k=1 being a thin film coater, k=2 being a winder and k=3 being a slitter. There are four types of facility tools, l=1, 2, 3, and 4. If facility type does not apply to a specific processing tool, it is indicated by the element of l=0. As illustrated in FIG. 5, position 2 of processing step 2 is occupied by a thin film coater with thermal evaporation and thickness sensor, which dictates that $T_{2214}=1$ and $T_{2212}=1$. As also illustrated in FIG. 5, position 1 of processing step 3 is occupied by a winder, which dictates that $T_{3120}=1$. As further illustrated in FIG. 5, position 3 in processing step 1 is not occupied by any tool, which dictates that $T_{13kl}=0$ (where k=1,2,3 and l=1,2,3,4). In the set-up process of the configuration tensor, all the elements are assigned to be zero initially. A respective element $T_{ijkl}$ is changed to the value of one when a certain tool type (index k) with certain facility type (index l) is assigned to a certain position (index j) for a certain processing step (index i).

Figure 6:
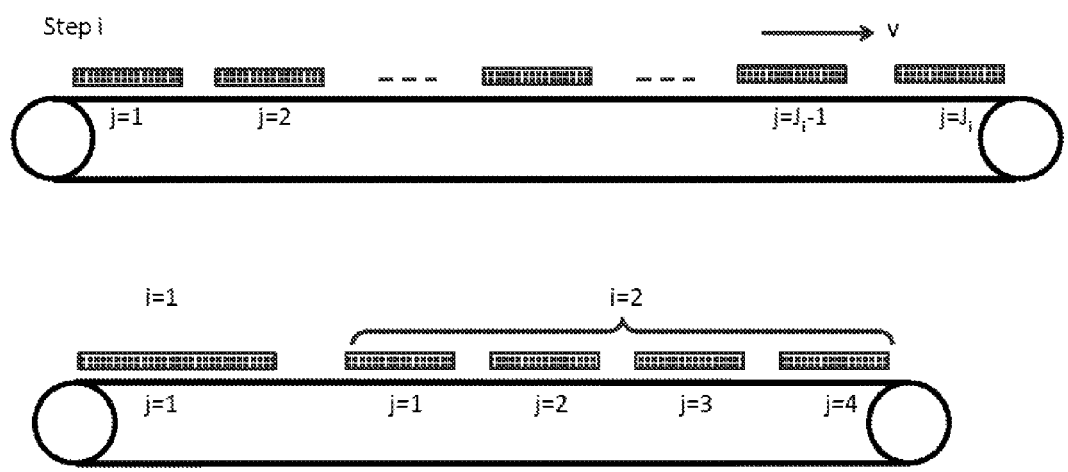
FIG. 6 is a simplified illustration of a serially configured continuously moving web design according to an embodiment of the present invention.

FIG. 6 is a simplified illustration of a serially configured continuously moving web design according to an embodiment of the present invention. As shown in FIG. 6, a moving web configured with two or more rotating units or rollers, which control the web's movement, can be used as a platform for forming electrochemically active materials. The separate materials overlying the moving web can represent a battery device in various stages of processing as described previously wherein each step "i" includes one or more positions "j". Those skilled in the art will recognize other variations, modifications, and alternatives.

Figure 7:
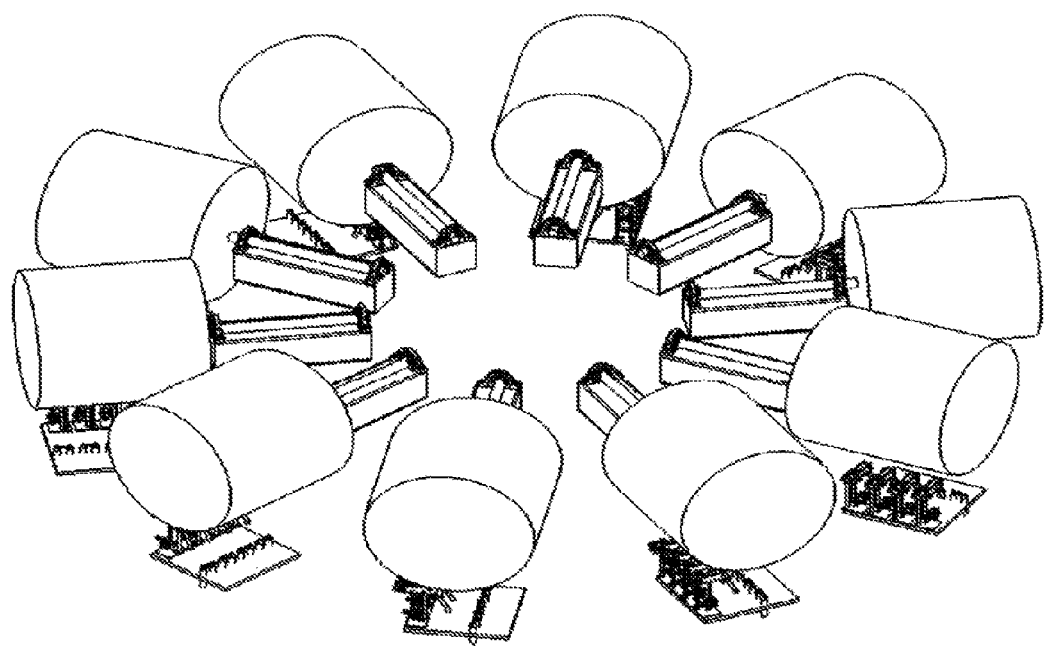
FIG. 7 is a simplified illustration of a carousel design configuration.

FIG. 7 is a simplified illustration of a carousel design configuration. In the carousel design, a drum stays in each processing tool for a certain period until the processing task is finished and moves to the next process tool. In this design, the number of drums is equal to the number of total processing tools and all the processing tools are arranged along a circular line. There can be other variations, modifications, and alternatives.

Figure 8:
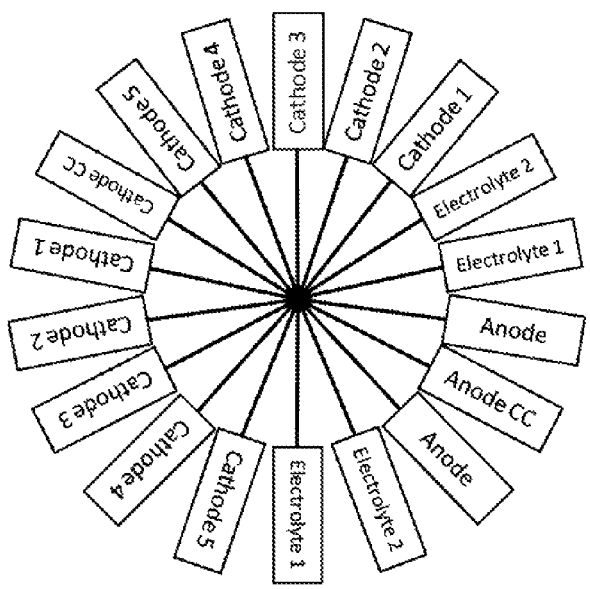
FIG. 8 is a simplified illustration of a carousel design and its optimal configuration that yields the best internal rate of return.

FIG. 8 is a simplified illustration of a carousel design and its optimal configuration that yields the best internal rate of return. In this example, there are 8 processing steps which includes the deposition of anode current collector, a first layer of anode, a first layer of electrolyte, a first layer of cathode, cathode current collector, a second layer of cathode, a second layer of electrolyte and a second layer of anode. For the optimal configuration, each of the electrolyte layers is finished in two deposition zones with each zone depositing exactly half of the desired electrolyte layer thickness; each of the cathode layers is finished in five deposition zones with each zone depositing exactly one fifth of the desired cathode layer thickness. The optimized configuration yields a production rate of 0.458 million batteries per year with a initial capital expenditure of 19.1 million dollars. The optimized internal rate of return is 0.201 and the capital expenditure divided by the production rate is 0.0240. The tensor format discussed in the figure descriptions above is further explained below.

The configuration tensor T is set up with binary values of zero and one. Take a third-order tensor for example, a respective element $T_{ijk}$ is one when a certain tool type (index k) is assigned to a certain position (index j) for a certain processing step (index i).

$$T_{ijk} = \begin{cases} 1 & \text{when position } j \text{ at step } i \text{ is occupied by tool type } k \\ 0 & \text{otherwise} \end{cases}$$

The advantage of this setup of configuration tensor is that the parameters such as capital expenditure and throughput rate can be easily obtained using tensor multiplication. For example, the capital expenditure $X_{ij}^c$ of the processing tool located at position j at processing step i is obtained by:

$$X_{ij}^c = (x_c)_k T_{ijk} = x_c^T T(:,:,j)$$

where $x_c$ is a K by 1 vector defining the capital expenditure of K types of processing tools and $(x_c)_k T_{ijk}$ defines a the multiplication along the dimension indexed by k. Similarly, the throughput rate $R_{ij}$ at position j at processing step i is obtained by:

$$R_{ij} = (r)_k T_{ijk} = r(i,:) T(:,i,j)$$

where $(r)_{ik}$ is a I by K matrix ($2^{nd}$ order tensor) and $(r)_{ik} T_{ijk}$ defines a multiplication along the dimension indexed by k.

To calculate the throughput of thin film deposition processing tools (thin film coaters), first consider the time required to deposit the component layer required for a whole battery τ, $$\tau = \frac{LW\delta}{rA} \frac{1}{zm}$$

where L is the length of the battery component layer, W is the width of battery component layer, r is the rate, in angstrom per second, for the component layer material to be deposited by the specified processing tool with the specified processing facility, A is the effective deposition area of the processing tool, and z is the number of deposition zones inside one coater, δ is the thickness of the battery component layer and m the number of processing tools used for the battery component layer. The throughput of the coater for this specific battery component layer is then:

$$R = \frac{N}{\tau} = \frac{NA}{LW} \frac{rzm}{\delta}$$

where N is the machine running time in a year.

The total expenditure of the all the processing tools used is calculated by:

$$X_{total}^c = \sum_{j=1}^{J} \sum_{i=1}^{I} X_{ij}^c$$

The production rate of the whole line, in number of units made per year, is determined by the rate-limiting step:

$$R_{total} = \min_{1 \leq i \leq I} \left\{ \sum_{j=1}^{J} R_{ij} \right\}$$

The described configuration tensor is expandable to include a fourth dimension to index the facility type.

$$T_{ijkl} \begin{cases} 1 & \text{when position } j \text{ at step } i \text{ is occupied} \\ & \text{by tool type } k \text{ with processing facility type } l \\ 0 & \text{otherwise} \end{cases}$$

The corresponding calculations for expenditure and rate are:

$$R_{ij} = (R)_{ikl} T_{ijkl} = \sum_k \sum_l [R(:,:,i) T(:,i,j)]_{kl}$$

$$X_{ij}^c = (x_c)_{kl} T_{ijkl} = \sum_k \sum_l x_c T(:,i,j)$$

where $R_{ikl} \in \square^{I \times K \times L}$ is the production rate when processing tool k with facility l is used for step I and $(x_c)_{kj} \in \square^{K \times L}$ is tool capital expenditure for processing tool type k equipped with processing facility l.

To evaluate different manufacturing processing tool configurations, at least one target financial variables are used. The target financial variable comprises at least internal rate of return (IRR), modified internal rate of return (MIRR), net present value (NPV) and weighted average cost of capital (WACC). The net present value (NPV) is calculated by:

$$NPV = -X_{total}^c + \sum_{y=1}^{n} \frac{1}{(1+r_{dis})^y} [p \cdot R_{total} - X_{total}^o]$$

where $r_{dis}$ is discount rate, p is the profit for one unit of the product, $X_{total}^o$ is the total operational cost per year and n is the duration of the project in years. The internal rate of return (IRR) is obtained by finding the exact discount rate $r_{dis}$ which satisfies that the net present value (NPV) is zero, $$-X_{total}^c + \sum_{y=1}^{n} \frac{1}{(1+r_{dis})^y} [p \cdot R_{total} - X_{total}^o] = 0$$

Due to the intrinsic drawbacks of the internal rate of return, two other financial variables, modified internal rate of return (MIRR) and weighted average cost of capital (WACC), are also used to evaluate processing tool configurations and the manufacturing facility design. Modified internal rate of return (MIRR) is obtained by:

$$MIRR = \left(\frac{FVCF}{IO}\right)^{\frac{1}{n}} - 1$$

where FVCF is the total future value of the cash flows, IO is the cost of investment, and n is the duration of the project in years. The total future value of the cash flows is obtained by summing the future values of the individual cash flows (CF).

$$FVCF = \sum_{i=1}^{n} CF \cdot (1+r)^{n-i}$$

The cost of investment is obtained by summing the present values of the individual investment.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A method for forming a manufacturing facility comprising:
   providing a plurality of processing tools for arrangement within a predetermined spatial region of one or more manufacturing facilities;
   assigning a plurality of variables, respectively, for the plurality of processing tools;
   providing the plurality of variables in a tensor format;
   defining a target financial variable to evaluate different manufacturing processing tool configurations, the target financial variable including at least internal rate of return (IRR), modified internal rate of return (MIRR), net present value (NPV) and weighted average cost of capital (WACC);
   processing the plurality of variables in a tensor relationship to reduce a magnitude of the target variable;
   determining an optimized set of the plurality of processing tools and respective configuration with the plurality of processing tools associated with the reduced magnitude of the target variable;
   using the optimized set of the plurality of processing tools in the respective configuration in the one or more manufacturing facilities; and
   operating the optimized set of the plurality of processing tools for manufacturing of a solid state thin film battery device.

2. The method of claim 1 wherein the target financial variable is calculated based on inputs comprising capital expenditure, production rate, profit of one single product unit, operation expenditure and discount rate.

3. The method of claim 1 wherein the targeted financial variable is simplified as a ratio of capital expenditure over production rate for a first-order analysis.

4. The method of claim 3 wherein the total capital expenditure is provided by a sum of the capital expenditure of the plurality of processing tools associated with processing facilities included inside the tools.

5. The method of claim 3 wherein the production rate is provided by a throughput rate of a rate-limiting processing tool.

6. A method for forming a manufacturing facility comprising:
   providing a plurality of processing tools for arrangement within a predetermined spatial region of one or more manufacturing facilities, wherein the plurality of processing tools comprises physical vapor deposition based thin film coater, chemical vapor deposition based thin film coater, atomic layer deposition thin film coater, winder, slitter, packaging machine using a technique of at least but not limited to dip coating, and robotic arms for attaching leads, wiring, moving, handling and electronic control component assembling;
   assigning a plurality of variables, respectively, for the plurality of processing tools;
   providing the plurality of variables in a tensor format;
   defining a target financial variable to evaluate different manufacturing processing tool configurations;
   processing the plurality of variables in a tensor relationship to reduce a magnitude of the target variable;
   determining an optimized set of the plurality of processing tools and respective configuration with the plurality of tools associated with the reduced magnitude of the target variable;
   using the optimized set of the plurality of processing tools in the respective configuration in the one or more manufacturing facilities; and
   operating the optimized set of tools for manufacturing of a solid state thin film battery device.

7. The method of claim 6 wherein the physical vapor deposition based thin film coater includes at least one of the processing facilities comprising vacuum chamber, electron-beam evaporator, thermal evaporator, pulsed laser deposition tool, flash evaporator and ion-beam assisted deposition tool and ion-beam sputtering tool.

8. A method for forming a manufacturing facility comprising:
   providing a plurality of processing tools for arrangement within a predetermined spatial region of one or more manufacturing facilities;
   assigning a plurality of variables, respectively, for the plurality of processing tools, wherein the plurality of variables comprises capital cost of the tool, throughput of the tool, downtime of the tool, yield of the tool, efficiency of the tool, material load and unload time of the tool, preparation time of the tool, work in process for the tool and operational cost of the tool including labor and electricity cost;
   providing the plurality of variables in a tensor format;
   defining a target financial variable to evaluate different manufacturing processing tool configurations;
   processing the plurality of variables in a tensor relationship to reduce a magnitude of the target variable;
   determining an optimized set of the plurality of processing tools and respective configuration with the plurality of tools associated with the reduced magnitude of the target variable;
   using the optimized set of the plurality of processing tools in the respective configuration in the one or more manufacturing facilities; and
   operating the optimized set of tools for manufacturing of a solid state thin film battery device.

9. A method for forming a manufacturing facility comprising:
   providing a plurality of processing tools for arrangement within a predetermined spatial region of one or more manufacturing facilities;
   assigning a plurality of variables, respectively, for the plurality of processing tools;
   providing the plurality of variables in a tensor format;

defining a target financial variable to evaluate different manufacturing processing tool configurations;

processing the plurality of variables in a tensor relationship to reduce a magnitude of the target variable;

determining an optimized set of the plurality of processing tools and respective configuration with the plurality of tools associated with the reduced magnitude of the target variable;

using the optimized set of the plurality of processing tools in the respective configuration in the one or more manufacturing facilities; and operating the optimized set of tools for manufacturing of a solid state thin film battery device, wherein the manufacturing facility is configured with a design comprising a continuously moving web design and a carousel design.

10. A system for designing a manufacturing plant, the system comprising:

a computer readable memory device, the computer readable memory including: one or more codes directed to a plurality of tool parameters corresponding respectively to a plurality of processing tools for arrangement within a predetermined spatial region of one or more manufacturing facilities;

one or more codes directed to a plurality of variables, respectively, for the plurality of processing tools; whereupon the plurality of variables are arranged in a tensor format; one or more codes directed to a processing tool configuration tensor;

a tensor operation module configured to process the plurality of variables and the configuration tensor to obtain production rate, capital expenditure, and operation expenditure;

a financial modeling module to reduce a magnitude of a target financial variable associated with a set of the plurality of variables and the configuration tensor; the target financial variable comprising at least internal rate of return (IRR), modified internal rate of return (MIRR), net present value (NPV) and weighted average cost of capital (WACC);

an optimization module configured to output an optimized configuration tensor associated with the optimal target financial variable; and a post-processing module configured to convert the optimal configuration tensor to output an optimized set of tools and associated configuration for the optimized set of tools.

11. The system of claim 10 wherein the processing tool configuration tensor is a n-order tensor with n dimensions to index a plurality of specifications comprising at least the processing step, allocated locations for tools inside the processing step, processing tool type and the type of facility used inside a processing tool.

12. The system of claim 10 wherein the processing tool configuration tensor comprises elements which have binary values of zero and one.

13. The system of claim 10 wherein the tensor operation module comprises adding two tensors, multiplying two tensors, transposing first-order and second-order tensors, contracting a tensor and finding the maximum or minimum element of a tensor or a subset of the tensor along with specified dimensions.

14. The system of claim 10 wherein the optimization module comprises one or more codes directed to an integer programming optimization process applying enumerative techniques, branch-and-bound techniques or cutting planes techniques.

15. The system of claim 10 wherein the post-processing module comprises importing the optimal configuration tensor, identifying non-zero elements which have exactly values of on; and outputting the optimal configuration information with specifications of which type of and how many processing tools are used for each processing step associated with which type of and how many processing facilities are used inside each processing tool.

16. A method for forming a manufacturing facility comprising:

providing a plurality of processing tools for arrangement within a predetermined spatial region of one or more manufacturing facilities;

assigning a plurality of variables, respectively, for the plurality of processing tools;

providing the plurality of variables in a tensor format;

defining a target financial variable to evaluate different manufacturing processing tool configurations;

processing the plurality of variables in a tensor relationship to reduce a magnitude of the target variable;

determining an optimized set of the plurality of processing tools and respective configuration with the plurality of tools associated with the reduced magnitude of the target variable;

using the optimized set of the plurality of processing tools in the respective configuration in the one or more manufacturing facilities; and operating the optimized set of tools for the manufacture of a solid state, hybrid thin film energy storage and conversion device, the solid state, hybrid thin film energy storage and conversion device including at least a solar cell device/battery device, an optical device/battery device, a capacitor device/battery device, a fuel cell device/battery device, a first battery device/second battery device and a micro-combustion engine device/battery device.

17. A method for forming a manufacturing facility comprising:

providing a plurality of processing tools for arrangement within a predetermined spatial region of one or more manufacturing facilities;

assigning a plurality of variables, respectively, for the plurality of processing tools;

providing the plurality of variables in a tensor format;

defining a target financial variable to evaluate different manufacturing processing tool configurations, wherein the target financial variable comprises at least internal rate of return (IRR), modified internal rate of return (MIRR), net present value (NPV) and weighted average cost of capital (WACC);

processing the plurality of variables in a tensor relationship to reduce a magnitude of the target variable;

determining an optimized set of the plurality of processing tools and respective configuration with the plurality of tools associated with the reduced magnitude of the target variable;

using the optimized set of the plurality of processing tools in the respective configuration in the one or more manufacturing facilities; and operating the optimized set of tools for manufacturing of a solid state, hybrid thin film energy storage and conversion device.

* * * * *